US008242831B2

United States Patent
Tong et al.

(10) Patent No.: US 8,242,831 B2
(45) Date of Patent: Aug. 14, 2012

(54) TAMPER RESISTANT FUSE DESIGN

(75) Inventors: Xianghong Tong, Hillsboro, OR (US);
Zhanping Chen, Portland, OR (US);
Kevin X. Zhang, Portland, OR (US);
Zhiyong Ma, Hillsboro, OR (US); Kevin D. Johnson, Hillsboro, OR (US); Jun He, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 12/651,341

(22) Filed: Dec. 31, 2009

(65) Prior Publication Data

US 2011/0156801 A1 Jun. 30, 2011

(51) Int. Cl.
*H01H 85/02* (2006.01)

(52) U.S. Cl. ......... 327/525; 257/209

(58) Field of Classification Search .......... 327/526, 327/527, 525; 257/209, 529
See application file for complete search history.

(56) References Cited

U.S. PATENT DOCUMENTS

| 4,413,272 | A | * | 11/1983 | Mochizuki et al. | 257/529 |
| 4,943,538 | A | * | 7/1990 | Mohsen et al. | 438/215 |
| 5,276,653 | A | * | 1/1994 | McKenny | 365/225.7 |
| 5,412,593 | A | * | 5/1995 | Magel et al. | 365/96 |
| 5,917,909 | A | * | 6/1999 | Lamla | 705/67 |
| 5,954,817 | A | * | 9/1999 | Janssen et al. | 713/169 |
| 6,956,277 | B1 | * | 10/2005 | Wu et al. | 257/529 |
| 7,087,975 | B2 | * | 8/2006 | Lehmann et al. | 257/530 |
| 7,103,782 | B1 | * | 9/2006 | Tugenberg et al. | 713/194 |
| 7,196,570 | B2 | * | 3/2007 | Chung | 327/525 |
| 7,333,383 | B2 | * | 2/2008 | Vogelsang | 365/225.7 |
| 7,437,574 | B2 | * | 10/2008 | Ronkka et al. | 713/194 |
| 7,561,059 | B2 | * | 7/2009 | Diluoffo et al. | 340/638 |
| 7,761,714 | B2 | * | 7/2010 | Luzzi et al. | 713/182 |
| 7,804,352 | B2 | * | 9/2010 | Sung et al. | 327/525 |
| 7,978,549 | B2 | * | 7/2011 | Jeong | 365/200 |
| 2006/0285183 | A1 | * | 12/2006 | Sato et al. | 358/540 |
| 2008/0157270 | A1 | * | 7/2008 | Kim et al. | 257/530 |
| 2009/0002119 | A1 | | 1/2009 | Nirschl | |
| 2009/0136041 | A1 | | 5/2009 | Tsu | |
| 2009/0195285 | A1 | * | 8/2009 | Kamiya et al. | 327/218 |
| 2009/0267636 | A1 | | 10/2009 | Choi et al. | |

FOREIGN PATENT DOCUMENTS

| JP | 07-105685 A | 4/1995 |
| WO | 2011/081811 A2 | 7/2011 |
| WO | 2011/081811 A3 | 11/2011 |

OTHER PUBLICATIONS

International Search Report and Written Opinion received for PCT Patent Application No. PCT/US2010/059461, mailed on Sep. 7, 2011, 10 pages.

* cited by examiner

*Primary Examiner* — Thomas J Hiltunen

(74) *Attorney, Agent, or Firm* — David L. Guglielmi

(57) ABSTRACT

A tamper resistant fuse design is generally presented. In this regard, an apparatus is introduced comprising a plurality of fuses in an integrated circuit device to store values and a plurality of resistors in parallel to the fuses, wherein each fuse includes a parallel resistor to provide a potential dissipation path around the fuse. Other embodiments are also described and claimed.

20 Claims, 2 Drawing Sheets

TAMPER RESISTANT FUSE DESIGN

FIELD

Embodiments of the present invention may relate to the field of integrated circuit fuses, and more specifically to a tamper resistant fuse design.

BACKGROUND

An integrated circuit device, for example a microprocessor, may contain sensitive information, such as encryption keys or manufacturer codes, for example, stored in programmed fuses. A concern with conventional fuse arrays, however, is that voltage contrasts between blown and un-blown fuses could be detectable by hackers or counterfeiters with malevolent motives.

BRIEF DESCRIPTION OF THE DRAWINGS

Embodiments of the present invention may become apparent from the following detailed description of arrangements, example embodiments, and the claims when read in connection with the accompanying drawings. While the foregoing and following written and illustrated disclosure focuses on disclosing arrangements and example embodiments of the invention, it should be clearly understood that the same is by way of illustration and example only and embodiments of the invention are not limited thereto.

The following represents brief descriptions of the drawings in which like reference numerals represent like elements and wherein.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
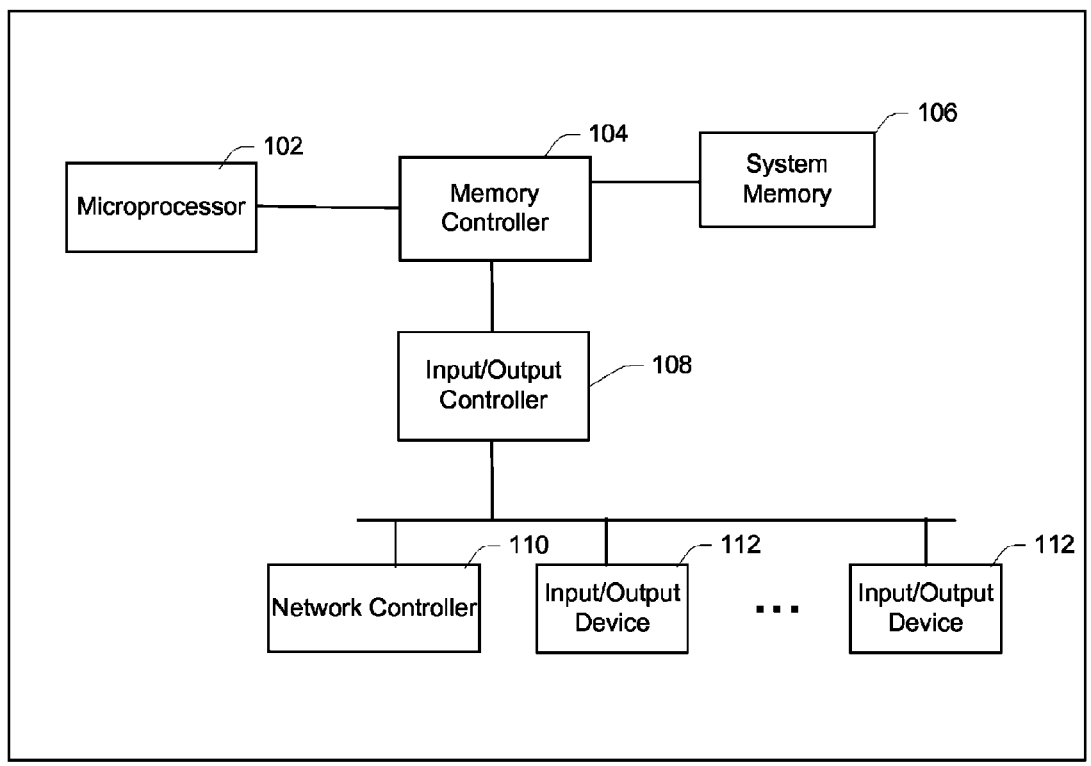
FIG. 1 is a block diagram of an example electronic appliance suitable for implementing a tamper resistant fuse design, in accordance with one example embodiment of the invention.

FIG. 1 is a block diagram of an example electronic appliance suitable for implementing a tamper resistant fuse design, in accordance with one example embodiment of the invention. Electronic appliance 100 is intended to represent any of a wide variety of traditional and non-traditional electronic appliances, laptops, cell phones, wireless communication subscriber units, personal digital assistants, or any electric appliance that would benefit from the teachings of the present invention. In accordance with the illustrated example embodiment, electronic appliance 100 may include one or more of microprocessor 102, memory controller 104, system memory 106, input/output controller 108, network controller 110, and input/output device(s) 112 coupled as shown in FIG. 1.

Microprocessor 102 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, microprocessor 102 is an Intel® compatible processor. Microprocessor 102 may have an instruction set containing a plurality of machine level instructions that may be invoked, for example by an application or operating system. Microprocessor 102 may include elements as described in greater detail in regards to FIG. 2.

Memory controller 104 may represent any type of chipset or control logic that interfaces system memory 106 with the other components of electronic appliance 100. In one embodiment, a link which communicatively couples microprocessor 102 and memory controller 104, may be a high speed/frequency serial link such as Intel® QuickPath Interconnect. In another embodiment, memory controller 104 may be incorporated along with microprocessor 102 into an integrated package.

System memory 106 may represent any type of memory device(s) used to store data and instructions that may have been or will be used by microprocessor 102. Typically, though the invention is not limited in this respect, system memory 106 will consist of dynamic random access memory (DRAM). In one embodiment, system memory 106 may consist of Rambus DRAM (RDRAM). In another embodiment, system memory 106 may consist of double data rate synchronous DRAM (DDRSDRAM).

Input/output (I/O) controller 108 may represent any type of chipset or control logic that interfaces I/O device(s) 112 with the other components of electronic appliance 100. In one embodiment, I/O controller 108 may be referred to as a south bridge. In another embodiment, I/O controller 108 may comply with the Peripheral Component Interconnect (PCI) Express™ Base Specification, Revision 1.0a, PCI Special Interest Group, released Apr. 15, 2003 and/or other revisions.

Network controller 110 may represent any type of device that allows electronic appliance 100 to communicate with other electronic appliances or devices. In one embodiment, network controller 110 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 110 may be an Ethernet network interface card.

Input/output (I/O) device(s) 112 may represent any type of device, peripheral or component that provides input to or processes output from electronic appliance 100.

Figure 2:
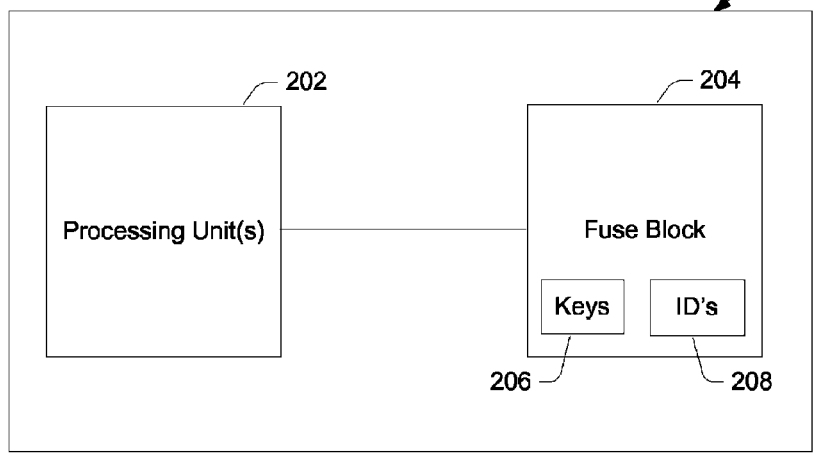
FIG. 2 is a block diagram of an example microprocessor suitable for implementing a tamper resistant fuse design, in accordance with one example embodiment of the invention.

FIG. 2 is a block diagram of an example microprocessor suitable for implementing a tamper resistant fuse design, in accordance with one example embodiment of the invention. Microprocessor 102 may include processing unit(s) 202 and fuse block 204, which may include keys 206 and ID's 208 as shown. Microprocessor 102 may also incorporate components or functions not shown, for example, memory controller 104.

Processing unit(s) 202 represent the logical and functional elements of microprocessor 102. In some examples, processing units(s) 202 may include processor cores, floating point units, controllers, registers, pointers, etc.

Fuse block 204 represents hardwired values that are programmed by selectively blowing fuses or antifuses or other components that may benefit from the teachings of the present invention. While shown as including keys 206 and ID's 208, fuse block 204 may include other fields or values that may benefit from a tamper resistant fuse design described herein. Keys 206 may represent secret encryption keys used by processing unit(s) 202 to implement secure communications. ID's 208 may represent manufacturer or system or other unique identification that may benefit from a tamper resistant fuse design described herein.

Figure 3:
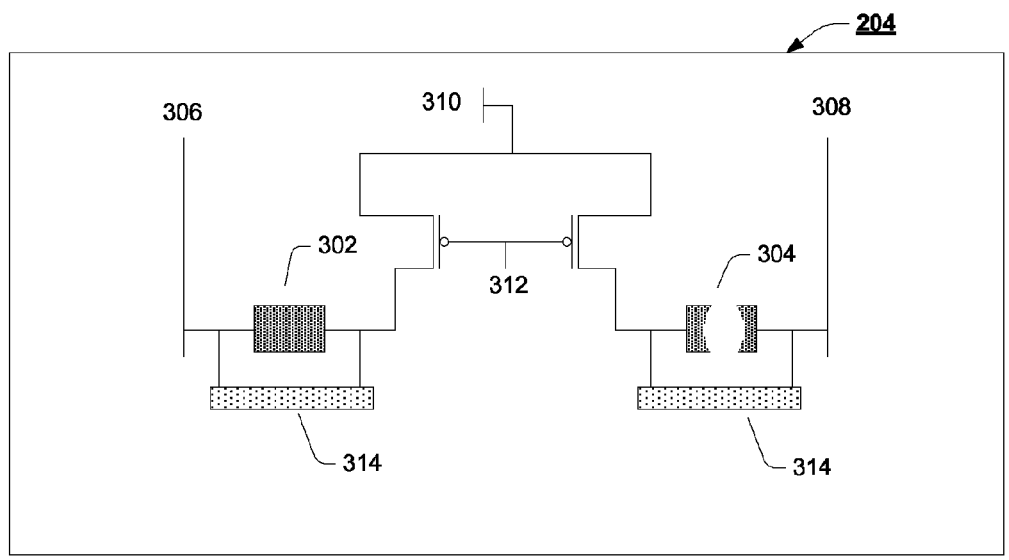
FIG. 3 is a block diagram of an example tamper resistant fuse design, in accordance with one example embodiment of the invention.

FIG. 3 is a block diagram of an example tamper resistant fuse design, in accordance with one example embodiment of the invention. Fuse block 204 may include unblown fuse 302, blown fuse 304, bit line 306, bit line 308, control voltage 310, select signal 312 and parallel elements 314. Fuses 302 and 304 may comprise a portion of keys 206 or ID's 208 and may have been programmed during a manufacturing process. Processing unit(s) 202 may access the values stored in fuses 302 and 304 by enabling select signal 312 and reading bit lines 306 and 308, respectively. Control voltage 310 may propagate to bit line 306 since unblown fuse 302 serves as a closed circuit while control voltage 310 would not have a dissipation path (if not for parallel elements 314) to bit line 308 since blown fuse 304 serves as an open circuit, thereby creating a potentially observable voltage contrast between fuses 302 and 304.

Parallel elements 314 may represent resistors or fuse elements in parallel to fuses 302 and 304 to provide a potential dissipation path around the fuses. Parallel elements 314 would have a resistance chosen to be considerably higher than unblown fuse 302, so that blown fuse 304 would not be mistakenly sensed as being unblown. Parallel elements 314 would also not have so high a resistance that parallel elements 314 serves as an open circuit, such that there would be no effective dissipation path around blown fuse 304.

In one embodiment, parallel elements 314 are metal wires of a same material as fuses 302 and 304. In another embodiment, parallel elements 314 are metal wires of a different material than fuses 302 and 304. Parallel elements 314 may comprise, but are not limited to being, metals such as platinum or tungsten, for example.

Figure 4:
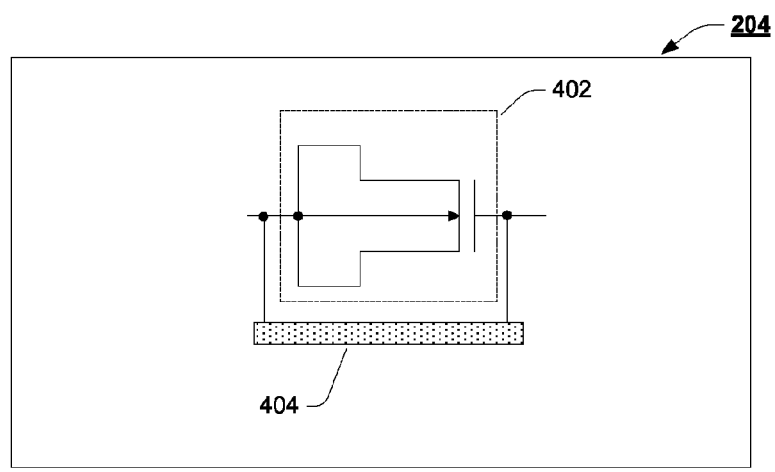
FIG. 4 is a block diagram of an example tamper resistant fuse design, in accordance with one example embodiment of the invention.

FIG. 4 is a block diagram of an example tamper resistant fuse design, in accordance with one example embodiment of the invention. Fuse block 204 may include antifuse 402 and parallel element 404. Antifuse 402 may serve as an open circuit when unblown and may become a closed circuit when blown. Parallel element 404 may be the same as or different than parallel elements 314. Parallel element 404 would have a resistance chosen to be considerably higher than antifuse 402 when blown (yet less than an open circuit), so that an unblown antifuse 404 would not be mistakenly sensed as being blown.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. An apparatus comprising:
a plurality of fuses in an integrated circuit device to store values; and
a plurality of resistors in parallel to the fuses, wherein each fuse includes a parallel resistor to provide a potential dissipation path around the fuse to obscure a voltage contrast between blown and unblown fuses.

2. The apparatus of claim 1, wherein the resistors comprise unblown fuses having a higher resistance than the fuses when unblown and having a resistance less than an open circuit.

3. The apparatus of claim 1, wherein the resistors comprise metal wires.

4. The apparatus of claim 3, wherein the metal wires comprise platinum.

5. The apparatus of claim 3, wherein the metal wires comprise tungsten.

6. The apparatus of claim 1, wherein the fuses comprise antifuses.

7. The apparatus of claim 6, wherein the resistors comprise unblown fuses having a higher resistance than blown antifuses and having a resistance less than an open circuit.

8. A microprocessor comprising:
a processing unit to process data;
a plurality of fuses to store values; and
a plurality of resistors in parallel to the fuses, wherein each fuse includes a parallel resistor to provide a potential dissipation path around the fuse to obscure a voltage contrast between blown and unblown fuses.

9. The microprocessor of claim 8, wherein the stored values comprise an encryption key.

10. The microprocessor of claim 8, wherein the resistors comprise unblown fuses having a higher resistance than the fuses when unblown and having a resistance less than an open circuit.

11. The microprocessor of claim 10, wherein the resistors and the fuses comprise wires of different metals.

12. The microprocessor of claim 11, wherein the resistors comprise a metal chosen from the group consisting of: platinum and tungsten.

13. The microprocessor of claim 8, wherein the fuses comprise antifuses.

14. The microprocessor of claim 13, wherein the resistors comprise unblown fuses having a higher resistance than blown antifuses and having a resistance less than an open circuit.

15. A system comprising:
a network controller;
a system memory; and
a microprocessor, wherein the microprocessor comprises:
a processing unit to process data;
a plurality of fuses to store values; and
a plurality of resistors in parallel to the fuses, wherein each fuse includes a parallel resistor to provide a potential dissipation path around the fuse to obscure a voltage contrast between blown and unblown fuses.

16. The system of claim 15, wherein the stored values comprise an encryption key.

17. The system of claim 15, wherein the resistors comprise unblown fuses having a higher resistance than the fuses when unblown and having a resistance less than an open circuit.

18. The system of claim 17, wherein the resistors and the fuses comprise wires of different metals.

19. The system of claim 18, wherein the resistors comprise a metal chosen from the group consisting of: platinum and tungsten.

20. The system of claim 15, wherein the fuses comprise antifuses and wherein the resistors comprise unblown fuses having a higher resistance than blown antifuses and having a resistance less than an open circuit.

\* \* \* \* \*